US010482593B2

(12) United States Patent
Sohn et al.

(10) Patent No.: US 10,482,593 B2
(45) Date of Patent: Nov. 19, 2019

(54) INSPECTION METHOD, INSPECTION SYSTEM, AND METHOD OF MANUFACTURING SEMICONDUCTOR PACKAGE USING THE SAME

(71) Applicant: Samsung Electronics Co., Ltd., Suwon-si, Gyeonggi-do (KR)

(72) Inventors: Younghoon Sohn, Incheon (KR); Yusin Yang, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 144 days.

(21) Appl. No.: 15/626,675

(22) Filed: Jun. 19, 2017

(65) Prior Publication Data

US 2018/0005369 A1 Jan. 4, 2018

(30) Foreign Application Priority Data

Jul. 4, 2016 (KR) .................. 10-2016-0084327

(51) Int. Cl.
*G06T 7/00* (2017.01)
*H01L 21/66* (2006.01)
*H01L 23/00* (2006.01)

(52) U.S. Cl.
CPC ............ *G06T 7/0008* (2013.01); *G06T 7/001* (2013.01); *H01L 22/12* (2013.01); *H01L 24/19* (2013.01); *G06T 2207/30148* (2013.01); *H01L 22/30* (2013.01); *H01L 2224/18* (2013.01)

(58) Field of Classification Search
None
See application file for complete search history.

(56) References Cited

U.S. PATENT DOCUMENTS

| 6,288,780 | B1 | 9/2001 | Fairley et al. |
| 6,944,325 | B2 | 9/2005 | Taguchi et al. |
| 7,655,482 | B2 | 2/2010 | Satya et al. |
| 7,711,177 | B2 | 5/2010 | Leslie et al. |
| 8,446,578 | B2 | 5/2013 | Sugihara et al. |
| 9,189,844 | B2 | 11/2015 | Wu et al. |
| 9,911,672 | B1* | 3/2018 | Wu ................. H01L 25/105 |
| 2006/0072807 | A1* | 4/2006 | Bultman ............ G01N 21/211 |
| | | | 382/149 |
| 2007/0115464 | A1 | 5/2007 | Harding et al. |
| 2010/0033716 | A1 | 2/2010 | Tsai et al. |
| 2016/0141213 | A1* | 5/2016 | Bishop .................. H01L 24/73 |
| | | | 438/16 |
| 2016/0300817 | A1* | 10/2016 | Do .......................... H01L 25/50 |
| 2017/0092617 | A1* | 3/2017 | Wu ........................ H01L 24/32 |
| 2017/0256466 | A1* | 9/2017 | Bishop .................... G06T 7/001 |

FOREIGN PATENT DOCUMENTS

JP 2005-32760 2/2005
JP 2007-81293 3/2007

* cited by examiner

*Primary Examiner* — Jiangeng Sun
(74) *Attorney, Agent, or Firm* — Harness, Dickey & Pierce, P.L.C.

(57) ABSTRACT

An inspection method includes generating first layout data including information on a shape of a first pattern group, generating second layout data including information on a shape of a second pattern group, obtaining a target image including images of the first and second pattern groups, and detecting a defect pattern from the target image by comparing the first and second layout data with the target image. The first pattern group, the second pattern group, and the defect pattern are provided at different heights from each other, from a top surface of a substrate.

20 Claims, 16 Drawing Sheets

LAYOUT2

INSPECTION METHOD, INSPECTION SYSTEM, AND METHOD OF MANUFACTURING SEMICONDUCTOR PACKAGE USING THE SAME

CROSS-REFERENCE TO RELATED APPLICATION

This U.S. non-provisional patent application claims priority under 35 U.S.C. § 119 to Korean Patent Application No. 10-2016-0084327, filed on Jul. 4, 2016, in the Korean Intellectual Property Office, the disclosure of which is hereby incorporated by reference in its entirety.

BACKGROUND

Example embodiments of the inventive concepts relate to an inspection method, an inspection system, and/or a method of manufacturing a fan-out package using the same.

As semiconductor chips have been highly integrated, sizes of the semiconductor chips may be reduced. However, distances between bumps on the semiconductor chips may be set by international standards of an international standards association such as joint electron device engineering council (JEDEC). Thus, it may be difficult to adjust the numbers of the bumps of the semiconductor chips. In addition, as the sizes of the semiconductor chips are reduced, handling and testing of the semiconductor chips may be difficult. Furthermore, a board on which a semiconductor chip is mounted may be diversified based on a size of the semiconductor chip. To solve these, a fan-out package has been developed.

A fan-out packaging process may include a package of forming insulating layers and interconnection lines on a substrate on which a semiconductor chip is mounted. After the process of forming the insulating layers and the interconnection lines, an inspection process may be performed to check whether defects occur at the insulating layers and the interconnection lines. Conditions of the fan-out packaging process may be improved (or, alternatively, optimized) through the inspection process, and whether a defect of the fan-out package occurs may be checked in an early stage by the inspection process.

SUMMARY

Example embodiments of the inventive concepts may provide inspection method and/or system capable of detecting a defect.

Example embodiments of the inventive concepts may also provide a method of manufacturing a semiconductor package, which is capable of detecting a defect in an early stage.

In an example embodiment, an inspection method may include generating first layout data, the first layout data including information on a first shape of a first pattern group; generating second layout data, the second layout data including information on a second shape of a second pattern group; obtaining a target image, the target image including images of the first pattern group and the second pattern group; and detecting a defect pattern based on the first layout data, the second layout data, and the target image, wherein the first pattern group, the second pattern group, and the defect pattern are patterns at different heights relative to a top surface of a substrate.

In an example embodiment, an inspection system may include an image measuring apparatus configured to measure an image of a pattern formed on a substrate; a memory device configured to store preliminary layout data, the preliminary layout data including information on a shape of the pattern; and a data processor configured to, obtain the image of the pattern from the image measuring apparatus, detect a defect pattern from the image based on the image and the preliminary layout data, and add information on a shape of the defect pattern into the preliminary layout data to generate layout data.

In an example embodiment, a method of manufacturing a semiconductor package may include forming a first pattern group on a substrate; measuring a first image of the first pattern group; generating first layout data based on the first image, the first layout data including information on a shape of the first pattern group; forming an interlayer layer covering the first pattern group on the substrate; forming a second pattern group on the interlayer layer; measuring a second image of the second pattern group; generating second layout data based on the second image, the second layout data including information on a shape of the second pattern group; measuring a target image including the first image and second image; and detecting a defect pattern from the target image based on the first layout data, the second layout data, and the target image, the defect pattern being at a height from the substrate between the first pattern group and the second pattern group.

A method of forming semiconductor packages includes generating first layout data based on a measurement of a first interconnect in a first one of the semiconductor packages and a first defect associated therewith; generating second layout data based on a measurement of a second interconnect in the first one of the semiconductor packages and a second defect associated therewith, the second interconnect being connected to the first interconnect by a via in an interlayer layer therebetween such that the second layout data does not include the first interconnect and the first defect associated therewith; and detecting a third defect associated with the via based on the first layout data and the second layout data.

BRIEF DESCRIPTION OF THE DRAWINGS

Example embodiments of the inventive concepts will become more apparent in view of the attached drawings and accompanying detailed description.

DETAILED DESCRIPTION

Hereinafter, some example embodiments of the inventive concepts will be described in detail with reference to the accompanying drawings.

Figure 1:
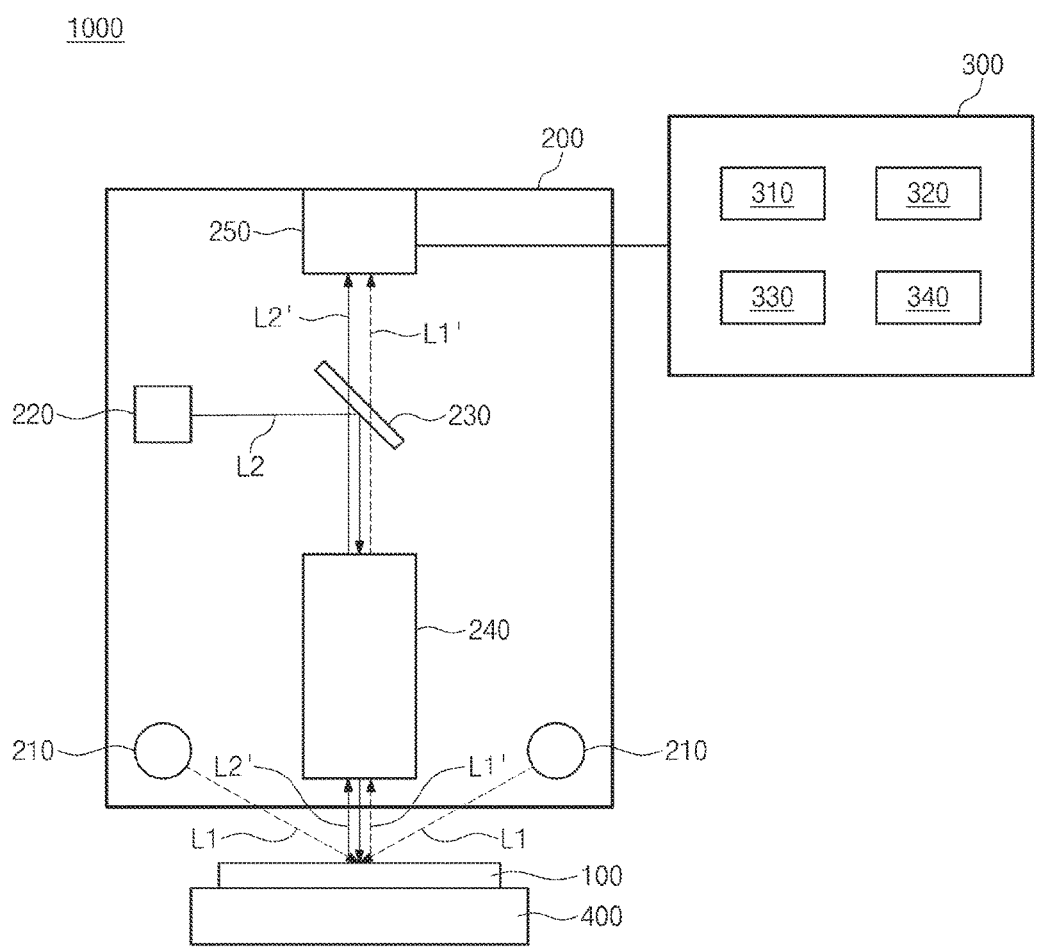
FIG. 1 is a schematic diagram illustrating an inspection system according to some example embodiments of the inventive concepts.
Figure 2:
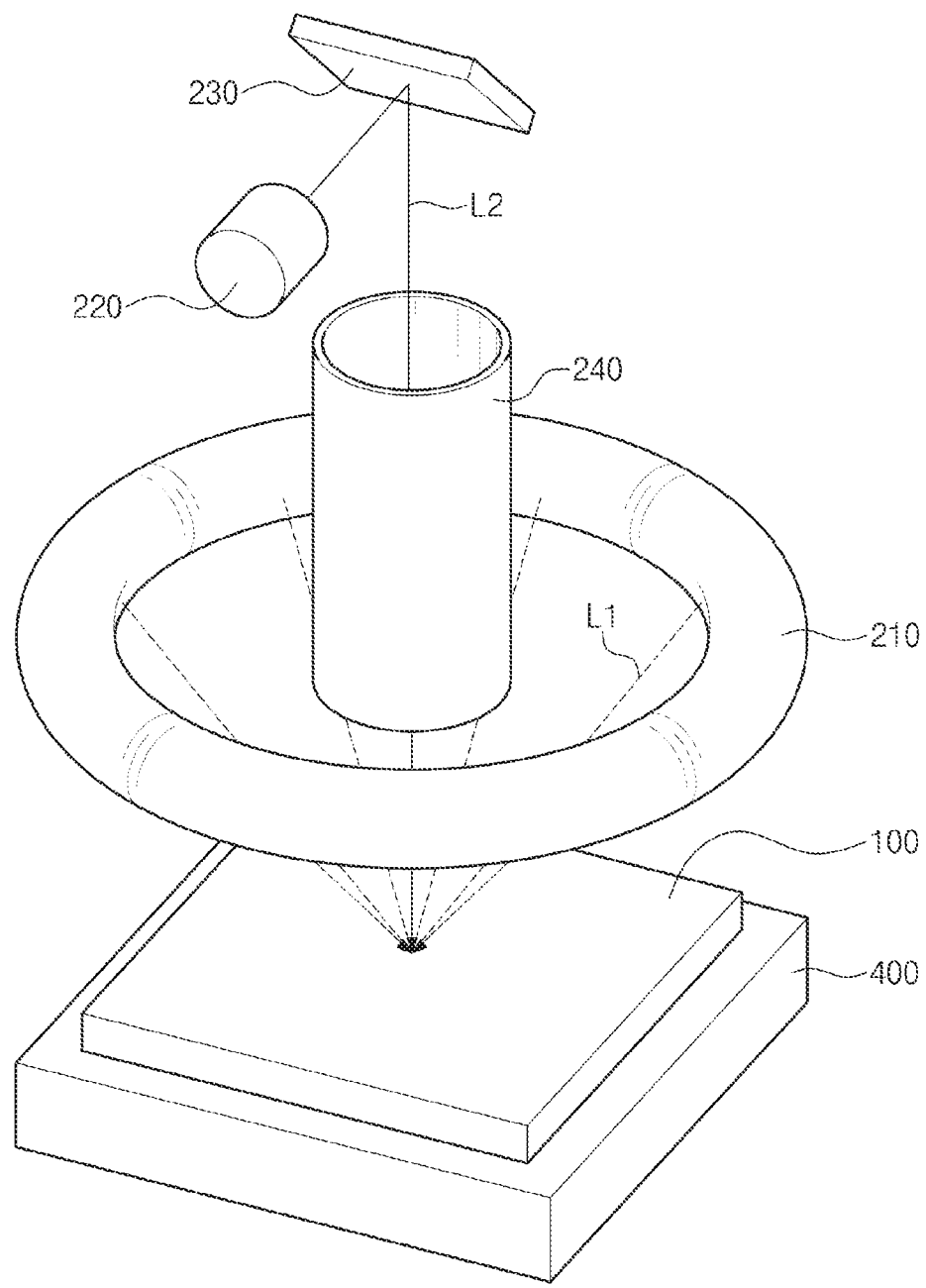
FIG. 2 is a perspective view illustrating a portion of an image measuring apparatus of FIG. 1.

FIG. 1 is a schematic diagram illustrating an inspection system according to some embodiments of the inventive concepts, and FIG. 2 is a perspective view illustrating a portion of an image measuring apparatus of FIG. 1.

Referring to FIGS. 1 and 2, an inspection system 1000 may include a stage 400 on which a substrate 100 is loaded, an image measuring apparatus 200 for measuring an image of patterns formed on the substrate 100, and a computer 300 storing and processing image data obtained from the image measuring apparatus 200. The image measuring apparatus 200 may be an apparatus used in a non-destructive test.

The image measuring apparatus 200 may include first and second light sources 210 and 220 irradiating light onto a top surface of the substrate 100, a reflection part 230 controlling a light path, a light receiving part 240 receiving light reflected from the top surface of the substrate 100, and an image sensor 250 generating an image using light reflected from the top surface of the substrate 100.

The light receiving part 240 may include at least one lens and may be disposed over the top surface of the substrate 100. The first light source 210 may be disposed above the top surface of the substrate 100 and may be laterally spaced apart from the light receiving part 240. In some example embodiments, the first light source 210 may have a ring shape surrounding a sidewall of the light receiving part 240. First light L1 emitted from the first light source 210 may be controlled to be incident on the top surface of the substrate 100 in a direction inclined to the top surface of the substrate 100. The first light L1 may be reflected and/or scattered from the top surface of the substrate 100, and scattering light L1' of the first light L1 may be provided to the image sensor 250 through the light receiving part 240. When the reflection part 230 is disposed on a light path of the scattering light L1', the scattering light L1' may pass through the reflection part 230 so as to be provided to the image sensor 250.

The reflection part 230 may be disposed between the substrate 100 and the image sensor 250. The second light source 220 may be laterally spaced apart from the reflection part 230. Second light L2 emitted from the second light source 220 may be controlled by the reflection part 230 so as to be incident on the top surface of the substrate 100 in a direction vertical to the top surface of the substrate 100. In other words, the reflection part 230 may control a light path of the second light L2. When the light receiving part 240 is disposed on a light path of the second light L2 reflected from the reflection part 230, the second light L2 may be incident on the top surface of the substrate 100 through the light receiving part 240 in the vertical direction. The second light L2 may be reflected from the top surface of the substrate 100, and reflected light L2' of the second light L2 may pass through the reflection part 230 so as to be provided to the image sensor 250. When the light receiving part 240 is disposed on a light path of the reflected light L2', the reflected light L2' may pass through the light receiving part 240 and the reflection part 230 in the order listed and may be then provided to the image sensor 250. The image sensor 250 may generate images of patterns formed on the substrate 100 by using the scattering light L1' of the first light L1 and the reflected light L2' of the second light L2.

The image measuring apparatus 200 may be a hybrid optical apparatus that includes a first optical system measuring an image of the patterns formed on the substrate 100 by using the first light source 210 and a second optical system measuring an image of the patterns formed on the substrate 100 by using the second light source 220.

The first light source 210 may be dark-field illumination, and the second light source 220 may be bright-field illumination. A depth of focus of the second optical system may be greater than a depth of focus of the first optical system.

The computer 300 may process image data obtained from the image sensor 250. The computer 300 may include a data processor 310 processing various data, a memory device 320 storing various data, a input/output (I/O) unit 330 and an interface unit 340.

The memory device 320 may include a hard disk and/or a non-volatile semiconductor memory device (e.g., a flash memory device, a phase-change memory device, and/or a magnetic memory device) storing a library therein. Detailed functions of the data processor 310 and the memory device 320 will be described later.

The I/O unit 330 may include at least one of a keyboard, a keypad, or a display device. The image data obtained from the image sensor 250 may be transmitted to the computer 300 through the interface unit 340. In addition, data processed by the computer 300 may be transmitted to the image sensor 250 through the interface unit 340. The interface unit 340 may include at least one of a cable element, a wireless element, or a universal serial bus (USB).

The data processor 310, the memory device 320, the I/O unit 330, and the interface unit 340 may be connected with each other through a data bus.

An inspection method using the inspection system 1000 will be described hereinafter.

Figure 3:
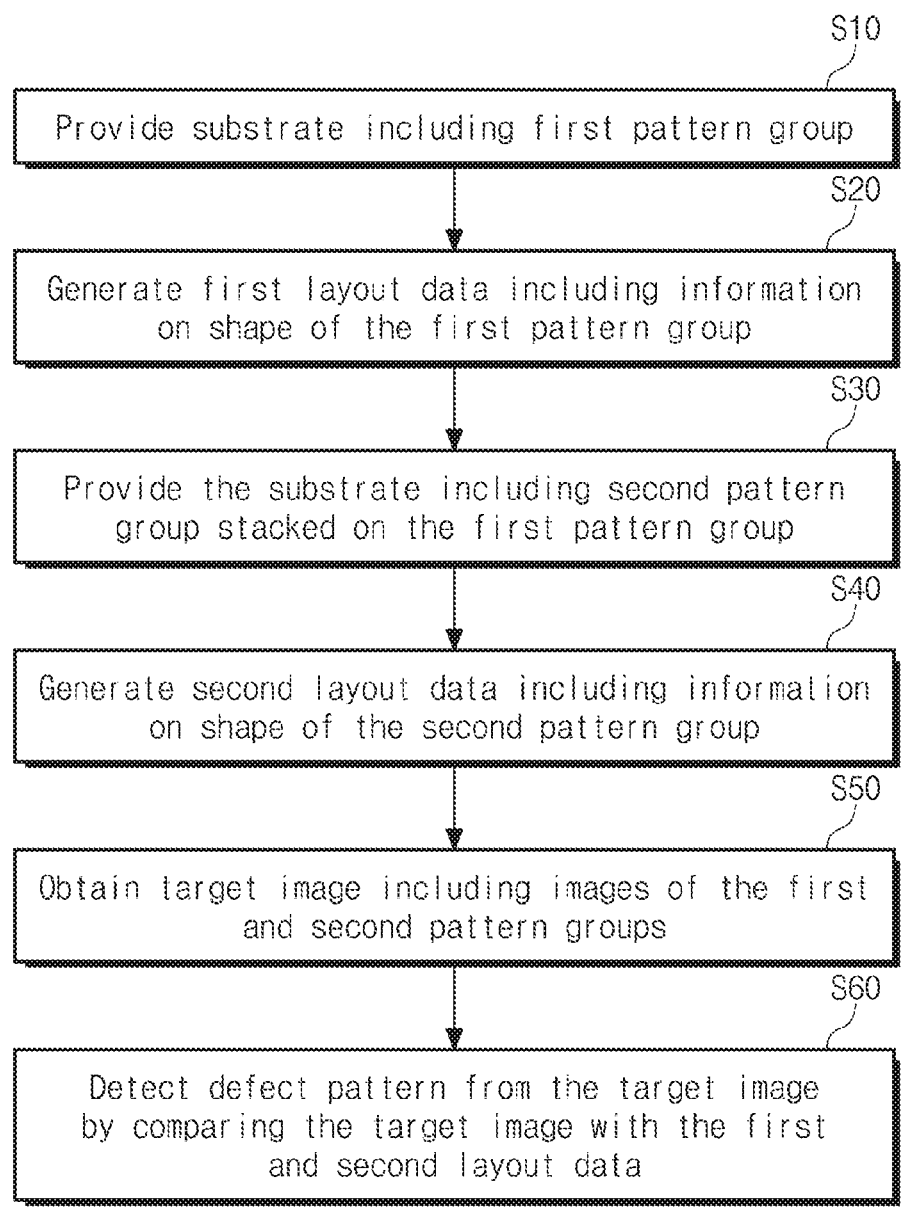
FIG. 3 is a flow chart illustrating an inspection method according to some example embodiments of the inventive concepts.
Figure 4:
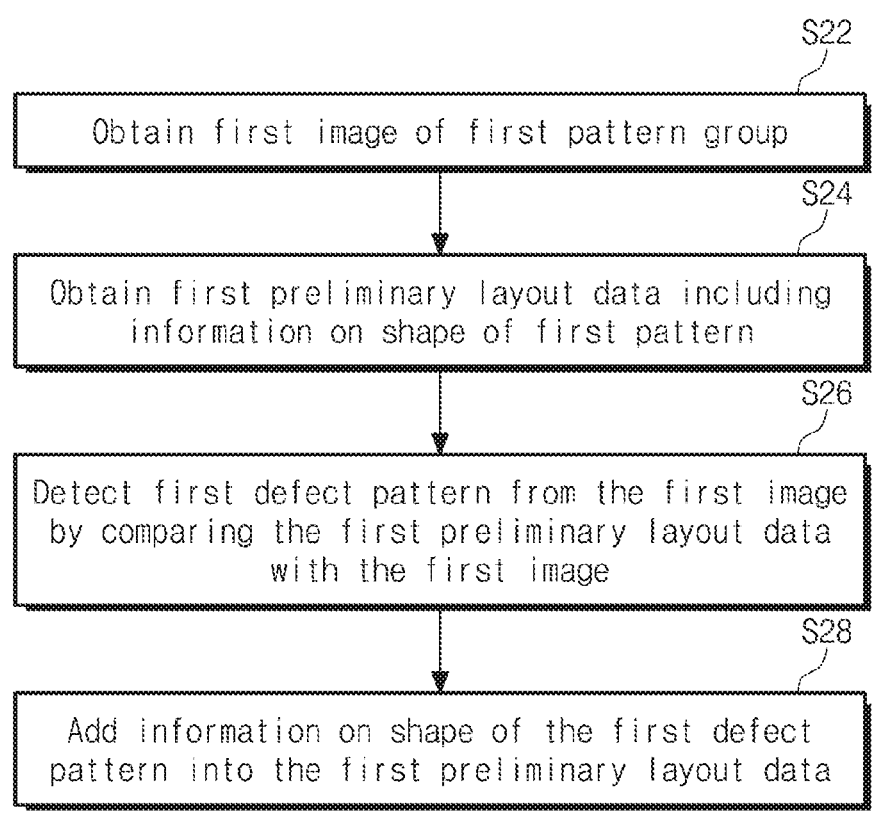
FIG. 4 is a flow chart illustrating an operation S20 of FIG. 3 in detail.
Figure 5:
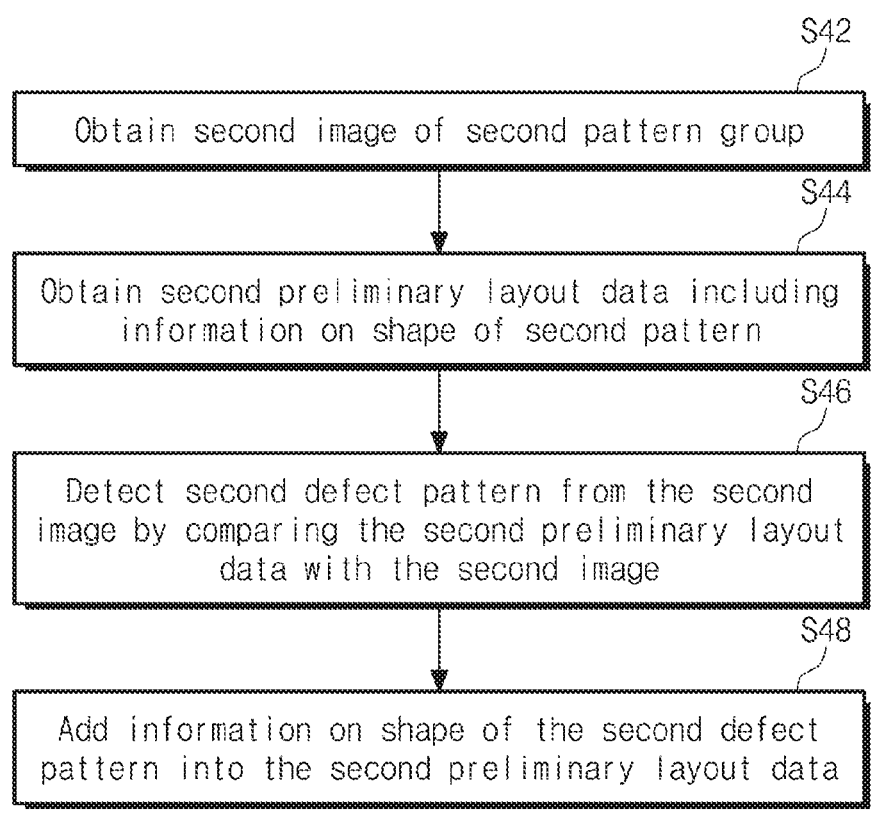
FIG. 5 is a flow chart illustrating an operation S40 of FIG. 3 in detail.
Figure 6A:
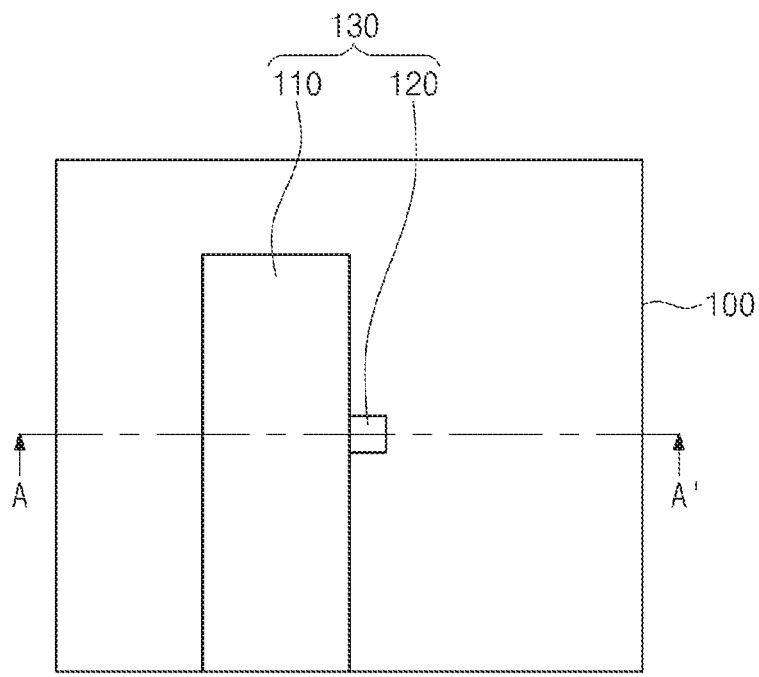
FIG. 6A is a plan view illustrating a substrate on which a first pattern group is formed.
Figure 6B:
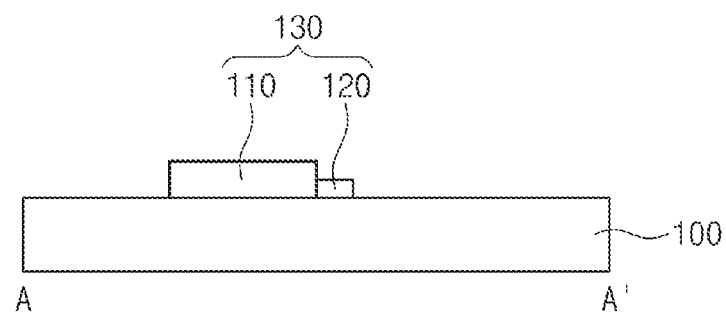
FIG. 6B is a cross-sectional view taken along a line A-A' of FIG. 6A.
Figure 10:
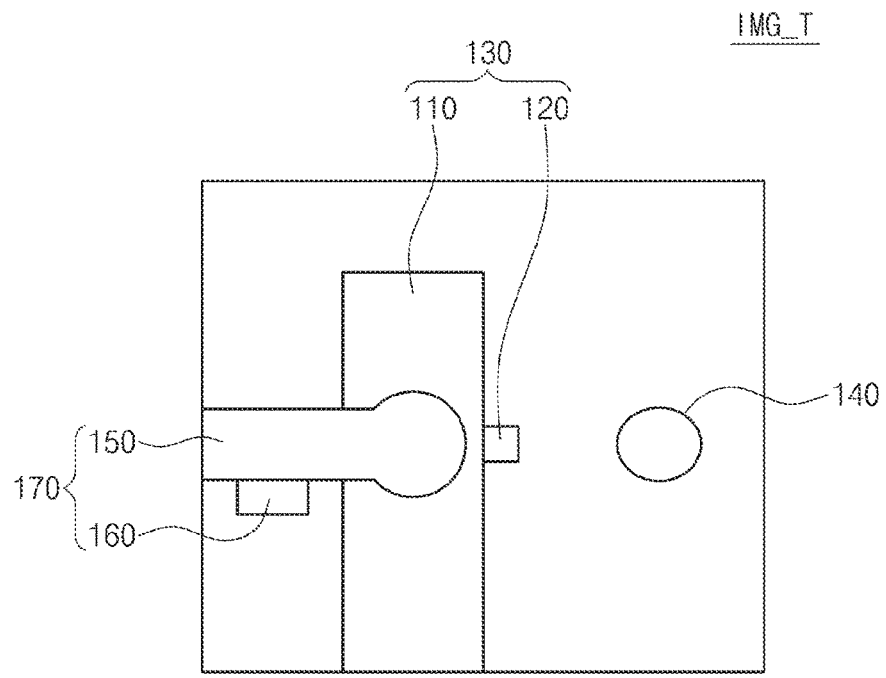
FIGS. 10 to 12 are plan views illustrating an operation S50 and an operation S60 of FIG. 3.
Figure 11:
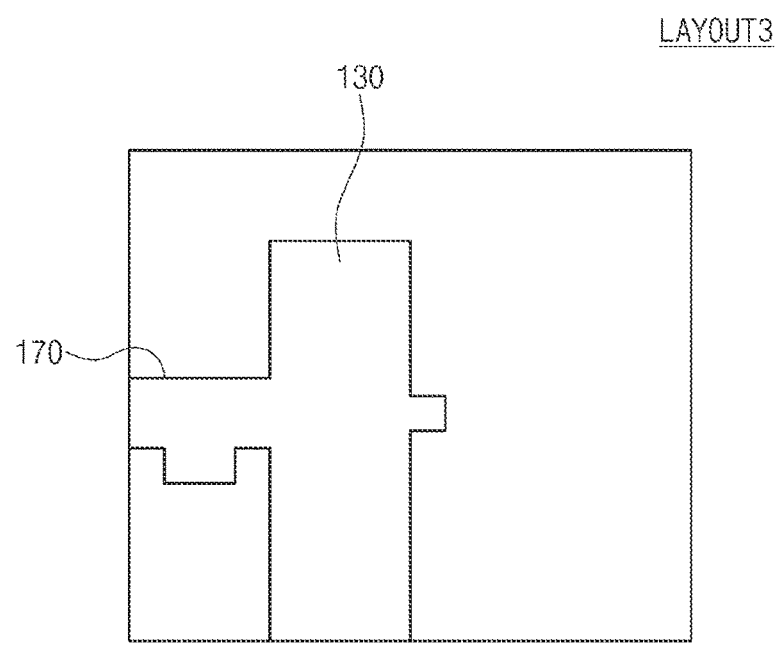
Figure 12:
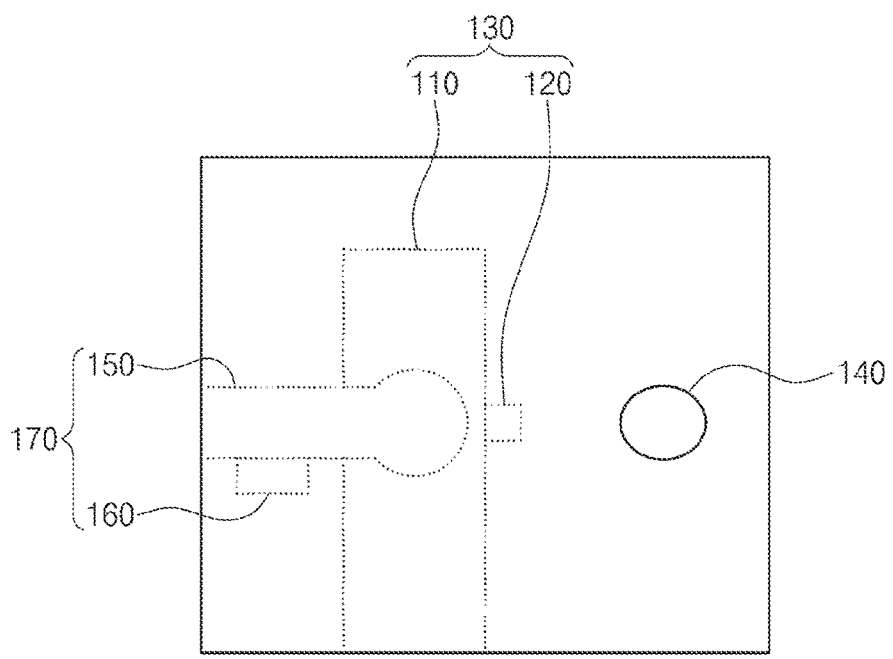

FIG. 3 is a flow chart illustrating an inspection method according to some example embodiments of the inventive concepts. FIG. 4 is a flow chart illustrating an operation S20 of FIG. 3 in detail, and FIG. 5 is a flow chart illustrating an operation S40 of FIG. 3 in detail. FIG. 6A is a plan view illustrating a substrate on which a first pattern group is formed, and FIG. 6B is a cross-sectional view taken along a line A-A' of FIG. 6A. FIGS. 7A to 7D are plan views illustrating the operation S20 of FIG. 3. FIG. 8A is a plan view illustrating a substrate on which a second pattern group is formed, and FIG. 8B is a cross-sectional view taken along a line A-A' of FIG. 8A. FIGS. 9A to 9D are plan views illustrating the operation S40 of FIG. 3. FIGS. 10 to 12 are plan views illustrating an operation S50 and an operation S60 of FIG. 3.

Referring to FIGS. 3, 6A, and 6B, in operation S10, a substrate 100 including a first pattern group 130 may be provided. The substrate 100 may be a semiconductor substrate or may be a package substrate in which semiconductor chips are mounted. The first pattern group 130 may include a first pattern 110 and a first defect pattern 120, which are formed on the substrate 100. The first defect pattern 120 may be any defect that may occur during a process of forming the first pattern 110.

Referring to FIGS. 3 and 4, in operation S20, the computer 300 may generate first layout data. The first layout data may include information on a shape of the first pattern group 130. In some example embodiments, the substrate 100 including the first pattern group 130 may be provided onto the stage 400 of the inspection system 1000 described with reference to FIG. 1. The image measuring apparatus 200 may measure an image of the first pattern group 130, and the computer 300 may generate the first layout data by using the image of the first pattern group 130.

Figure 7A:
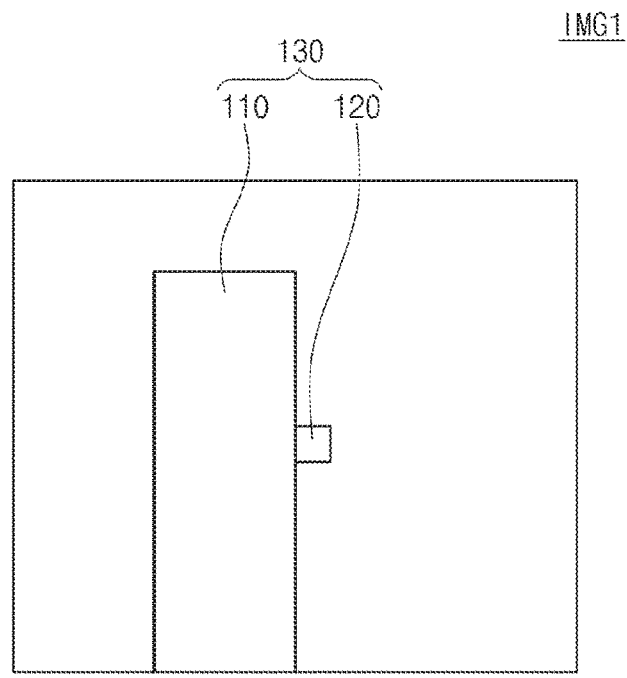
FIGS. 7A to 7D are plan views illustrating the operation S20 of FIG. 3.
Figure 8A:
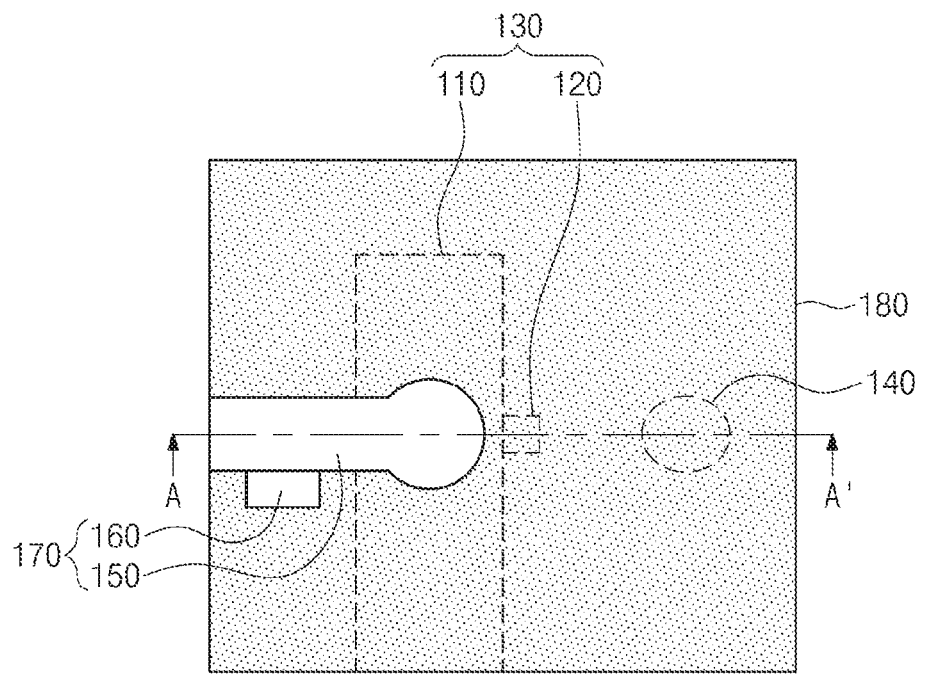
FIG. 8A is a plan view illustrating a substrate on which a second pattern group is formed.
Figure 8B:
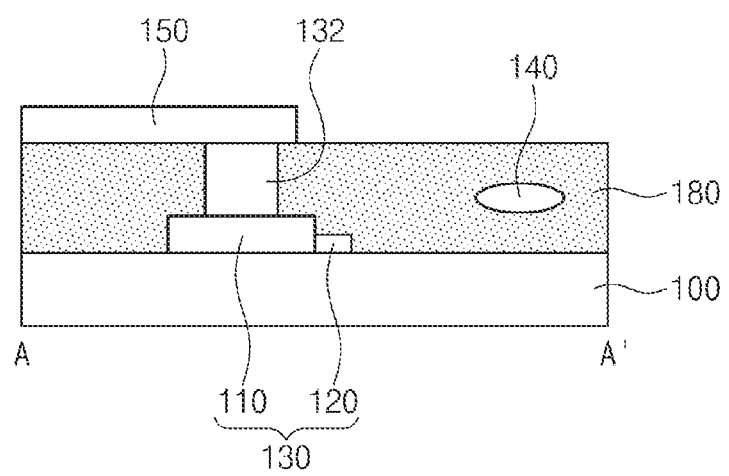
FIG. 8B is a cross-sectional view taken along a line A-A' of FIG. 8A.

In detail, referring to FIGS. 4 and 7A, in operation S22, the computer 300 may obtain a first image IMG1 of the first pattern group 130. The first image IMG1 may be an image measured using the first light source 210 of the image measuring apparatus 200. In other words, the first image IMG1 may be a dark-field image measured by the first optical system using the dark-field illumination. The data processor 310 of the computer 300 may obtain the first image IMG1 from the image measuring apparatus 200.

Figure 7B:
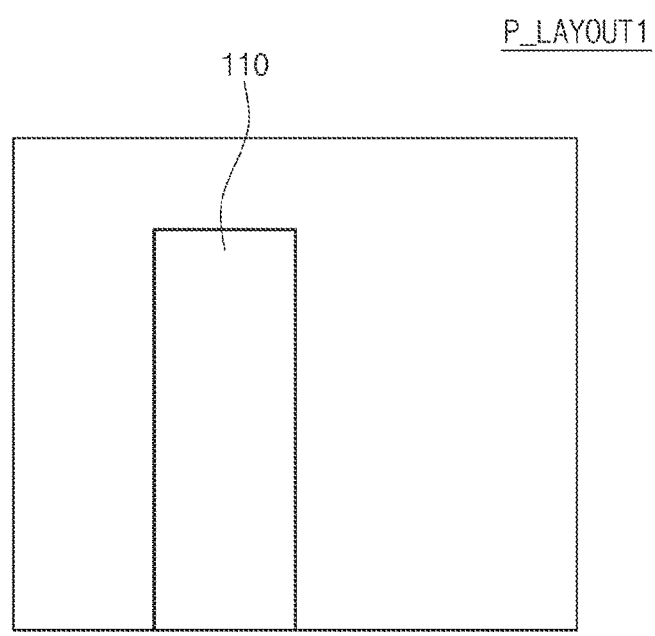

Referring to FIGS. 4 and 7B, in operation S24, the computer 300 may obtain first preliminary layout data P_LAYOUT1. The first preliminary layout data P_LAYOUT1 may include information on a shape of the first pattern 110. The first preliminary layout data P_LAYOUT1 may be a design layout including information on a planar shape of the first pattern 110. The first preliminary layout data P_LAYOUT1 may include data of a proper format (e.g., GDS II), which is for defining the first pattern 110 formed on the substrate 100. The memory device 320 of the computer 300 may store the first preliminary layout data P_LAYOUT1 and the data processor 310 of the computer 300 may obtain the first preliminary layout data P_LAYOUT1 from the memory device 320. In some example embodiments, the first preliminary layout data P_LAYOUT1 may be provided to the memory device 320 in advance of performing the measuring.

Figure 7C:
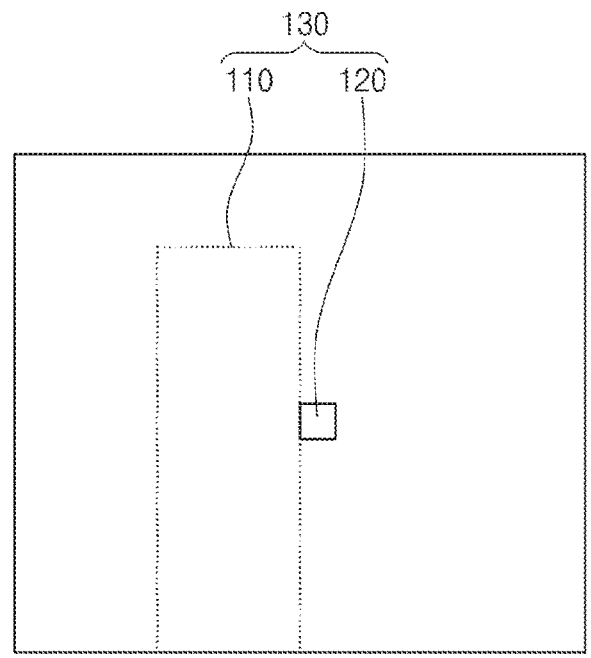

Referring to FIGS. 4 and 7C, in operation S26, the computer 300 may detect the first defect pattern 120 from the first image IMG1 by comparing the first preliminary layout data P_LAYOUT1 with the first image IMG1. Detecting the first defect pattern 120 may include selecting a portion of the first image IMG1, which does not coincide with the information on the shape in the first preliminary layout data P_LAYOUT1, as an image of the first defect pattern 120. The data processor 310 may compare the first image IMG1 and the first preliminary layout data P_LAYOUT1, which are obtained from the image measuring apparatus 200 and the memory device 320, respectively. In addition, the data processor 310 may select the portion of the first image IMG1, which does not coincide with the information on the shape in the first preliminary layout data P_LAYOUT1, as the image of the first defect pattern 120. The data processor 310 may obtain information on a shape of the first defect pattern 120 from the image of the first defect pattern 120. In some example embodiments, the shape of the first defect pattern 120 may be defined by the image of the first defect pattern 120.

Figure 7D:
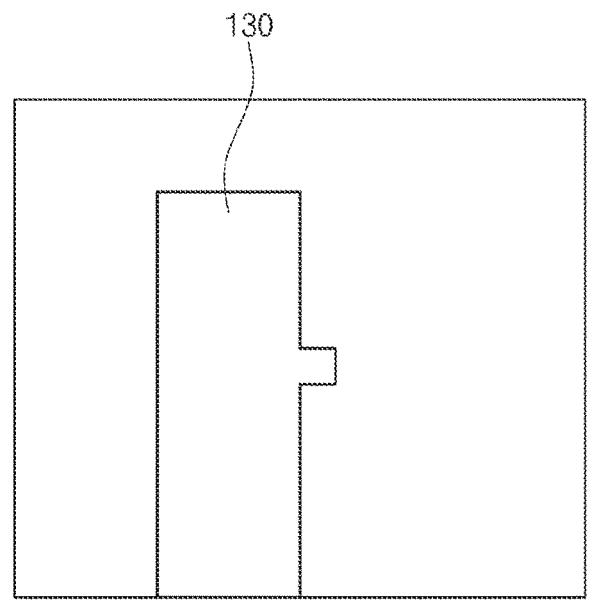

Referring to FIGS. 4 and 7D, in operation S28, the computer 300 may generate first layout data LAYOUT1 by adding the information on the shape of the first defect pattern 120 into the first preliminary layout data P_LAYOUT1. The first layout data LAYOUT1 may be a design layout including the information on the planar shape of the first pattern 110 and information on a planar shape of the first defect pattern 120. The first layout data LAYOUT1 may include data of the same format (e.g., GDS II) as the first preliminary layout data P_LAYOUT1. The first layout data LAYOUT1 may be stored in the memory device 320.

Referring to FIGS. 3, 8A, and 8B, in operation S30, the substrate 100 including a second pattern group 170 stacked on the first pattern group 130 may be provided. The substrate 100 may include an interlayer layer 180 provided on a top surface of the substrate 100 to cover the first pattern group 130, and the second pattern group 170 formed on the interlayer layer 180. The second pattern group 170 may include a second pattern 150 and a second defect pattern 160, which are formed on the interlayer layer 180. The second defect pattern 160 may be any defect that may occur during a process of forming the second pattern 150.

The substrate 100 may further include a via pattern 132 penetrating the interlayer layer 180 to connect the first pattern 110 to the second pattern 150, and a defect pattern 140 generated in the interlayer layer 180. The interlayer layer 180 may be a transparent or translucent layer. In some example embodiments, the first and second patterns 110 and 150 may be conductive patterns, and the interlayer layer 180 may be a transparent or translucent insulating layer. The via pattern 132 may be a conductive pattern for electrically connecting the first pattern 110 to the second pattern 150, and the defect pattern 140 may be a void formed in the interlayer layer 180.

Referring to FIGS. 3 and 5, in operation S40, the computer 300 may generate second layout data. The second layout data may include information on a shape of the second pattern group 170. In some example embodiments, the substrate 100 including the first pattern group 130 and the second pattern group 170 may be provided onto the stage 400 of the inspection system 1000 described with reference to FIG. 1. The image measuring apparatus 200 may measure an image of the second pattern group 170, and the computer 300 may generate the second layout data by using the image of the second pattern group 170.

Figure 9A:
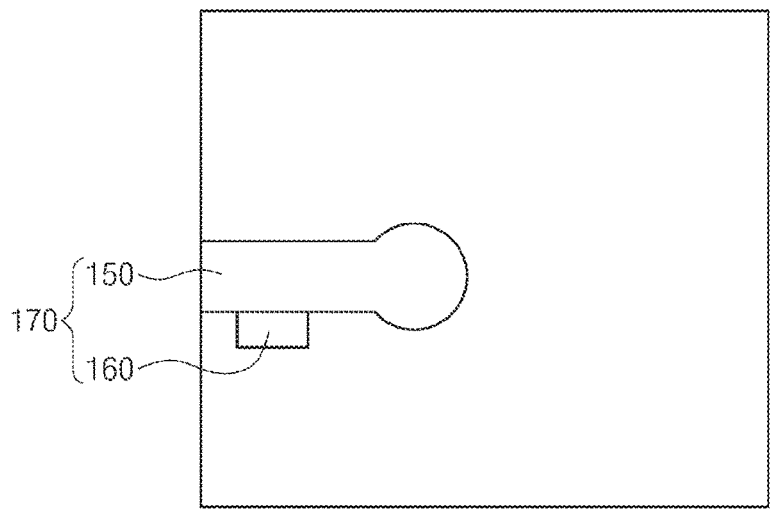
FIGS. 9A to 9D are plan views illustrating the operation S40 of FIG. 3.

In detail, referring to FIGS. 5 and 9A, in operation S42, the computer 300 may obtain a second image IMG2 of the second pattern group 170. The second image IMG2 may be an image measured using the first light source 210 of the image measuring apparatus 200. In other words, the second image IMG2 may be a dark-field image measured by the first optical system using the dark-field illumination. In this case, even though the interlayer layer 180 is the transparent or translucent layer, the shape of the first pattern group 130 may not be projected to the second image IMG2. In other words, the second image IMG2 may not include the image of the first pattern group 130. The data processor 310 of the computer 300 may obtain the second image IMG2 from the image measuring apparatus 200.

Figure 9B:
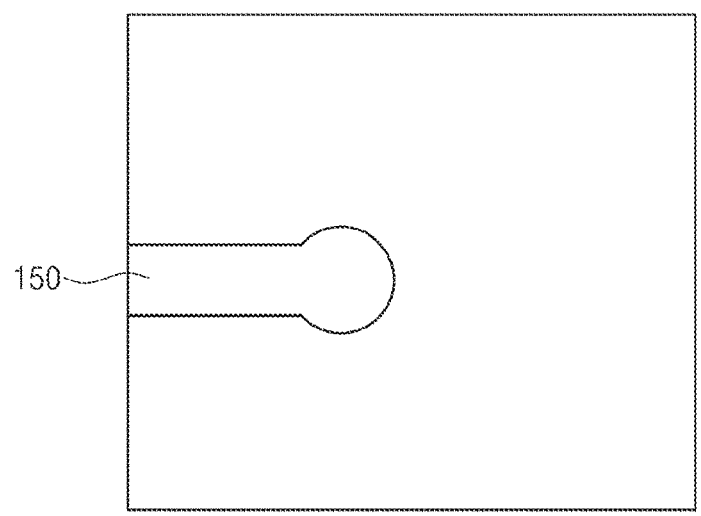

Referring to FIGS. 5 and 9B, in operation s44, the computer 300 may obtain second preliminary layout data P_LAYOUT2. The second preliminary layout data P_LAYOUT2 may include information on a shape of the second pattern 150. The second preliminary layout data P_LAYOUT2 may be a design layout including information on a planar shape of the second pattern 150. The second preliminary layout data P_LAYOUT2 may include data of a proper format (e.g., GDS II), for defining the second pattern 150 formed on the substrate 100. The memory device 320 of the computer 300 may store the second preliminary layout data P_LAYOUT2, and the data processor 310 of the computer 300 may obtain the second preliminary layout data P_LAYOUT2 from the memory device 320. In some example embodiments, the memory device 320 may store the second preliminary layout data P_LAYOUT2 in advance of the measuring operation.

Figure 9C:
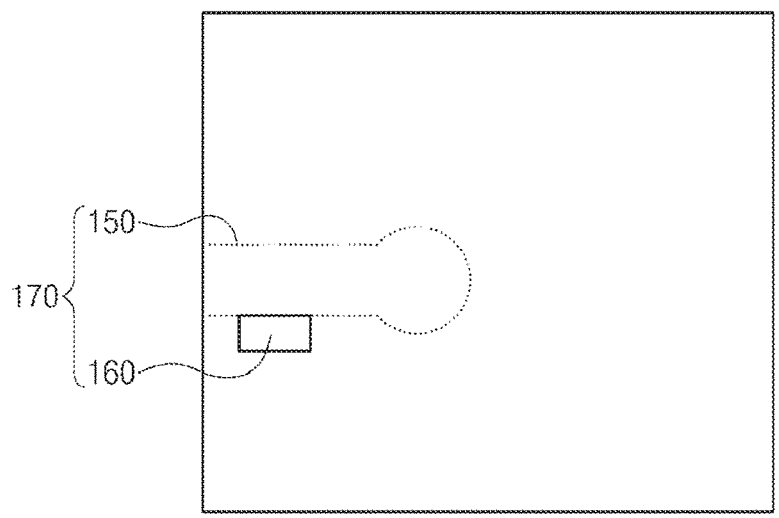

Referring to FIGS. 5 and 9C, in operation S46, the computer 300 may detect the second defect pattern 160 from the second image IMG2 by comparing the second preliminary layout data P_LAYOUT2 with the second image IMG2. Detecting the second defect pattern 160 may include selecting a portion of the second image IMG2, which does not coincide with the information on the shape in the second preliminary layout data P_LAYOUT2, as an image of the second defect pattern 160. The data processor 310 may compare the second image IMG2 and the second preliminary layout data P_LAYOUT2, which are obtained from the image measuring apparatus 200 and the memory device 320, respectively. In addition, the data processor 310 may select the portion of the second image IMG2, which does not coincide with the information on the shape in the second preliminary layout data P_LAYOUT2, as the image of the second defect pattern 160. The data processor 310 may obtain information on a shape of the second defect pattern 160 from the image of the second defect pattern 160.

Figure 9D:
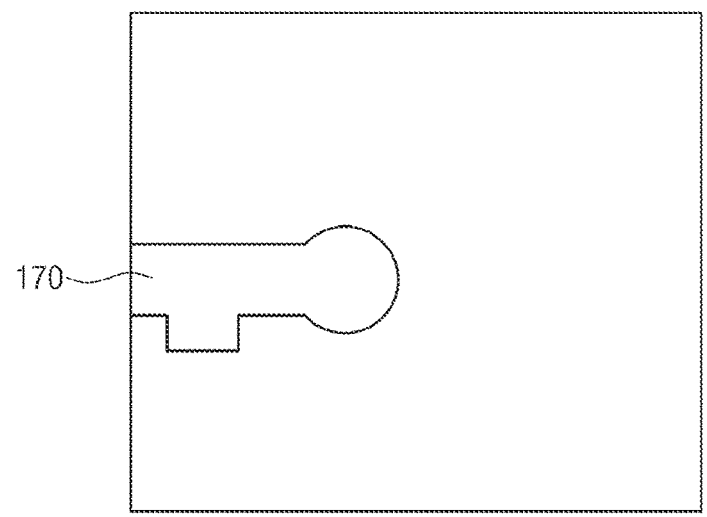

Referring to FIGS. 5 and 9D, in operation S48, the computer 300 may generate second layout data LAYOUT2 by adding the information on the shape of the second defect pattern 160 into the second preliminary layout data P_LAYOUT2. The second layout data LAYOUT2 may be a design layout including the information on the planar shape of the second pattern 150 and information on a planar shape of the second defect pattern 160. The second layout data LAYOUT2 may include data of the same format (e.g., GDS II) as the second preliminary layout data P_LAYOUT2. The second layout data LAYOUT2 may be stored in the memory device 320.

Referring to FIGS. 3 and 10, in operation S50, the computer 300 may obtain a target image IMG_T including the images of the first and second pattern groups 130 and 170. In some example embodiments, the substrate 100 including the first pattern group 130 and the second pattern group 170 may be provided onto the stage 400 of the inspection system 1000 described with reference to FIG. 1. The image measuring apparatus 200 may measure the target image IMG_T including the images of the first and second pattern groups 130 and 170 before or after measuring the second image IMG2 of the second pattern group 170, described with reference to FIGS. 5 and 9A.

The target image IMG_T may be an image measured using the second light source 220 of the image measuring apparatus 200. In other words, the target image IMG_T may be a bright-field image measured by the second optical system using the bright-field illumination. In this case, when the interlayer layer 180 is the transparent or translucent layer, patterns (i.e., the first pattern group 130 and the defect pattern 140) provided under the second pattern group 170 may be reflected or projected to the target image IMG_T and may be shown in the target image IMG_T. In other words, the target image IMG_T may include the image of the second pattern group 170, and images of the first pattern group 130 and the defect pattern 140 disposed under the second pattern group 170. The data processor 310 of the computer 300 may obtain the target image IMG_T from the image measuring apparatus 200.

Referring to FIGS. 3 and 12, in operation S60, the computer 300 may detect the defect pattern 140 from the target image IMG_T by comparing the target image IMG_T with the first layout data LAYOUT1 and the second layout data LAYOUT2 of FIGS. 7D and 9D. Detecting the defect pattern 140 may include selecting a portion of the target image IMG_T, which does not coincide with the information on the shapes in the first and second layout data LAYOUT1 and LAYOUT2, as an image of the defect pattern 140. The data processor 310 may obtain the first and second layout data LAYOUT1 and LAYOUT2 from the memory device 320. The data processor 310 may compare the target image IMG_T with each of the first and second layout data LAYOUT1 and LAYOUT2. As illustrated in FIG. 12, the data processor 310 may select the portion of the target image IMG_T, which does not coincide with the information on the shapes in the first and second layout data LAYOUT1 and LAYOUT2, as the image of the defect pattern 140.

Referring to FIGS. 3, 11, and 12, according to some example embodiments, the data processor 310 may merge the first layout data LAYOUT1 with the second layout data LAYOUT2 to generate third layout data LAYOUT3 illustrated in FIG. 11. The third layout data LAYOUT3 may be a composite design layout realized by merging the planar shapes of the first and second pattern groups 130 and 170 with each other. The third layout data LAYOUT3 may include data of the same format (e.g., GDS II) as the first and second layout data LAYOUT1 and LAYOUT2. The third layout data LAYOUT3 may be stored in the memory device 320. The data processor 310 may compare the third layout data LAYOUT3 with the target image IMG_T. In addition, as illustrated in FIG. 12, the data processor 310 may select the portion of the target image IMG_T, which does not coincide with the information on the shapes in the third layout data LAYOUT3, as the image of the defect pattern 140. Thus, the defect pattern 140 may be detected from the target image IMG_T.

Generally, when the interlayer layer 180 has a transparent or translucent property, it may be difficult to detect a defect (e.g., a void) generated in the interlayer layer 180 by an optical apparatus. For example, if a dark-field image of the interlayer layer 180 is measured using a dark-field illumination system, the dark-field image may have shapes of only patterns (e.g., the second pattern group 170) disposed on a surface of the interlayer layer 180. In other words, a shape of the defect may not be shown on the dark-field image. Alternatively, if a bright-field image of the interlayer layer 180 is measured using a bright-field illumination system, the bright-field image may include a shape of the defect and may also include shapes of patterns (e.g., the first pattern group 130) disposed under the interlayer layer 180. In other words, it may be difficult to select the defect from the bright-field image.

According to some example embodiments of the inventive concepts, the first layout data LAYOUT1 including the information on the shape of the first pattern group 130 may be generated using the dark-field image (i.e., the first image IMG1) of the first pattern group 130 including the first pattern 110 and the first defect pattern 120. Likewise, the second layout data LAYOUT2 including the information on the shape of the second pattern group 170 may be generated using the dark-field image (i.e., the second image IMG2) of the second pattern group 170 including the second pattern 150 and the second defect pattern 160.

When the interlayer layer 180 has the transparent and translucent property, the target image IMG_T may be a bright-field image that includes the shape of the first pattern group 130, the shape of the second pattern group 170, and the shape of the defect pattern 140 generated in the interlayer layer 180. In this case, the target image IMG_T may be compared with the first and second layout data LAYOUT1 and LAYOUT2, and the portion of the target image IMG_T, which does not coincide with the information on the shapes in the first and second layout data LAYOUT1 and LAYOUT2, may be selected as the image of the defect pattern 140. Thus, the defect pattern 140 may be easily detected.

In other words, example embodiments of the inventive concepts can provide the inspection method and system capable of easily detecting a defect generated in a transparent or translucent interlayer layer by using an optical apparatus.

Figure 13:
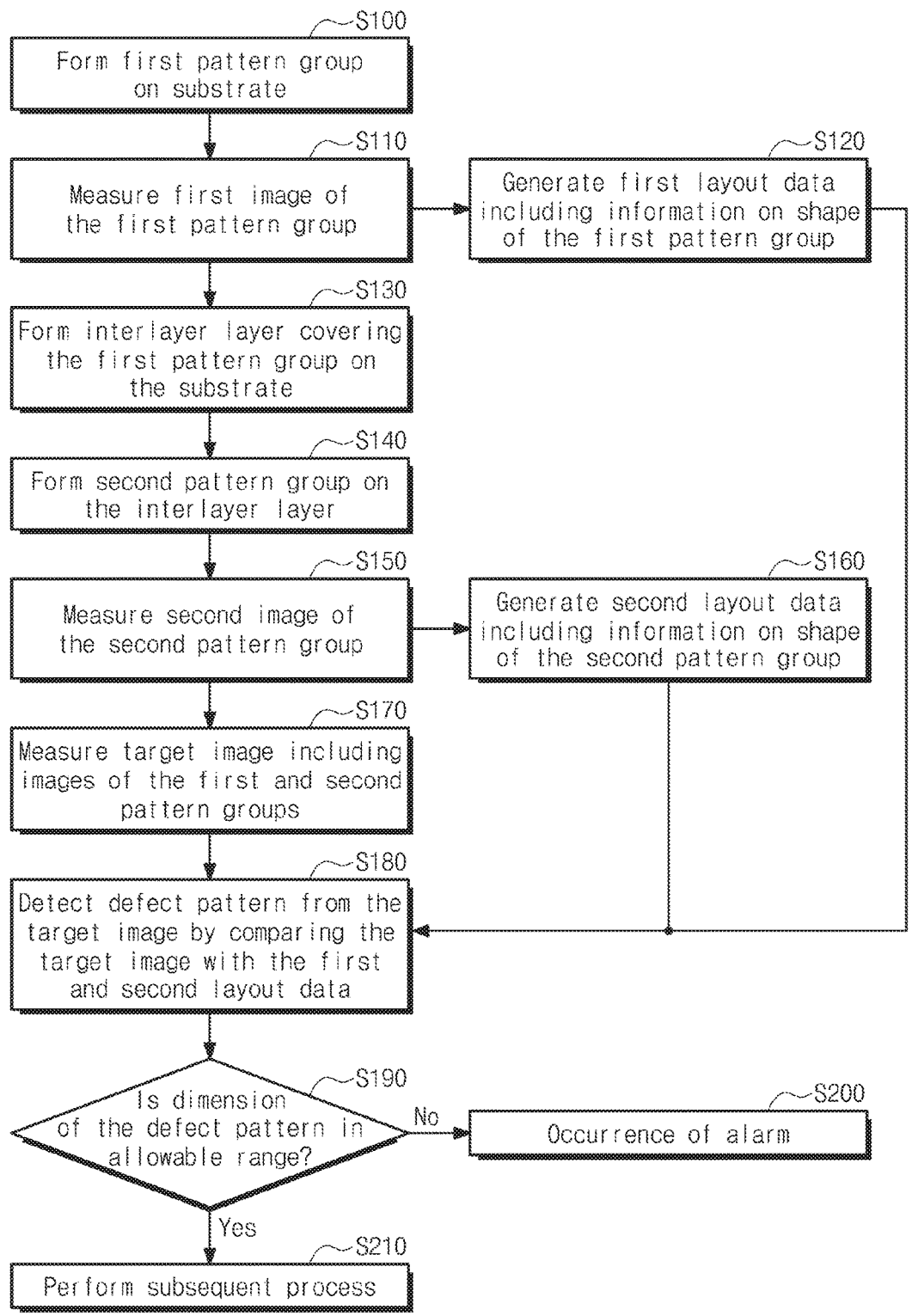
FIG. 13 is a flow chart illustrating a method of manufacturing a semiconductor package using an inspection method according to some example embodiments of the inventive concepts.
Figure 14A:
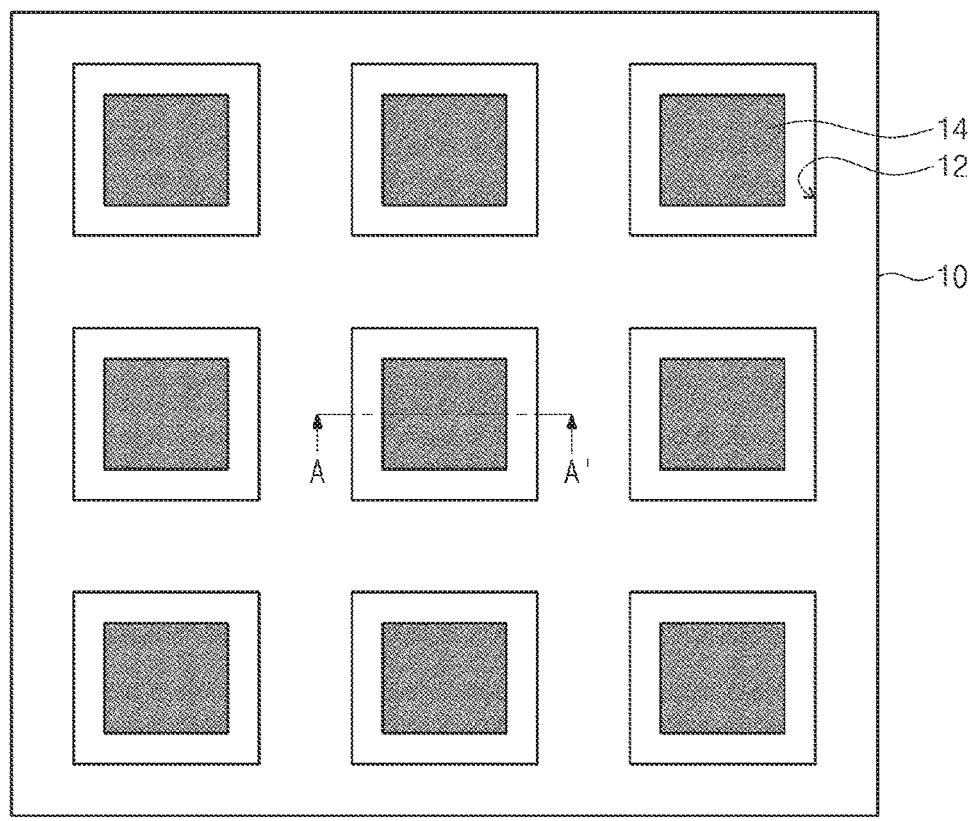
FIG. 14A is a plan view illustrating a package substrate according to some example embodiments of the inventive concepts.
Figure 14B:
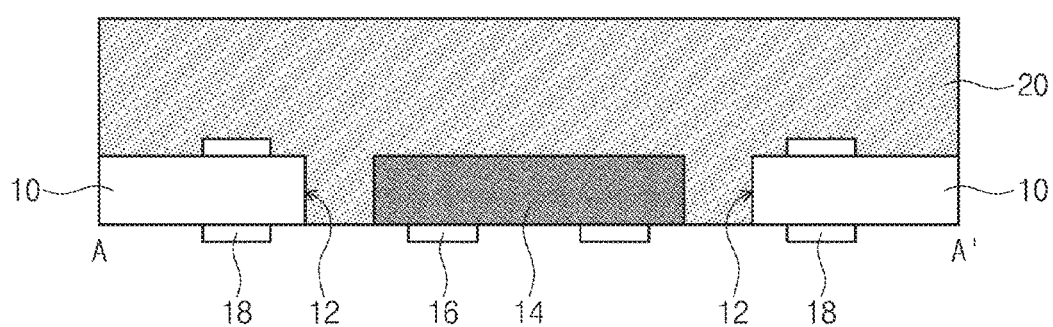
FIG. 14B is a cross-sectional view taken along a line A-A' of FIG. 14A.
Figure 15:
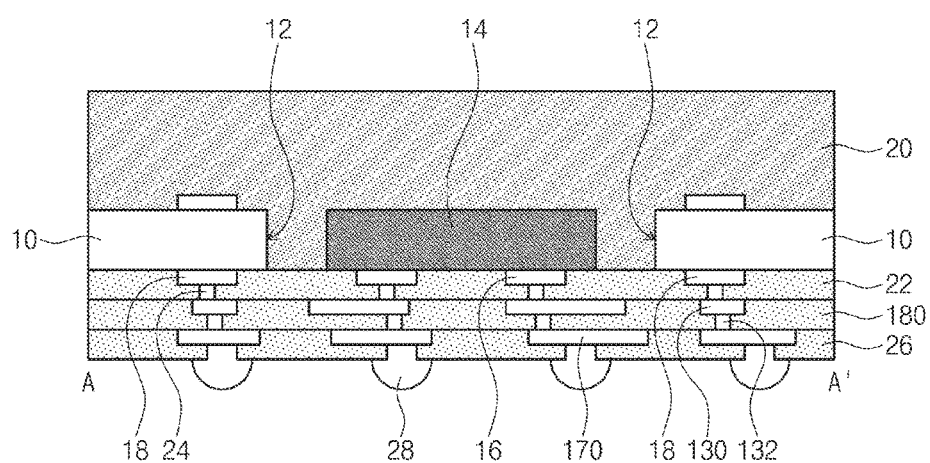
FIG. 15 is a cross-sectional view corresponding to the line A-A' of FIG. 14A to illustrate a semiconductor package manufactured using an inspection method according to some example embodiments of the inventive concepts.

FIG. 13 is a flow chart illustrating a method of manufacturing a semiconductor package using an inspection method according to some example embodiments of the inventive concepts. FIG. 14A is a plan view illustrating a package substrate according to some embodiments of the inventive concepts, and FIG. 14B is a cross-sectional view taken along a line A-A' of FIG. 14A. FIG. 15 is a cross-sectional view corresponding to the line A-A' of FIG. 14A to illustrate a semiconductor package manufactured using an inspection method according to some example embodiments of the inventive concepts.

Referring to FIGS. 14A and 14B, a substrate 100 may be provided. The substrate 100 may be a package substrate in which semiconductor chips are mounted. The substrate 100 may include a support substrate 10 including a plurality of cavities 12 penetrating the support substrate 10, semiconductor chips 14 respectively provided in the cavities 12, and a mold layer 20 provided on one surface of the support substrate 10 to cover the semiconductor chips 14. The mold layer 20 may extend into the cavities 12 so as to be disposed between the support substrate 10 and the semiconductor chips 14. The substrate 100 may include substrate pads 18 for electrically connecting the support substrate 10 to interconnection lines corresponding thereto, and device pads 16 for electrically connecting each of the semiconductor chips 14 to interconnection lines corresponding thereto. The interconnection lines will be described later. The substrate 100 may further include additional substrate pads 18 disposed between the support substrate 10 and the mold layer 20.

Referring to FIGS. 13 and 15, a first insulating layer 22 may be formed on the substrate 100. The first insulating layer 22 may be formed on opposite surface of the support substrate 10 from the mold layer 20, and may cover the substrate pads 18 and the device pads 16. The first insulating layer 22 may be in contact with portions of the mold layer 20, which extend into the cavities 12. The first insulating layer 22 may be a transparent or translucent layer and may include, for example, a photosensitive material. Vias 24 may be formed in the first insulating layer 22. The vias 24 may penetrate the first insulating layer 22 so as to be connected to the substrate pads 18 and the device pads 16.

In operation S100, a first pattern group 130 may be formed on the substrate 100 including the first insulating layer 22. The first pattern group 130 may include a first pattern 110 and a first defect pattern 120, as described with reference to FIGS. 6A and 6B. The first pattern 110 may be an interconnection line pattern electrically connected to a corresponding one(s) of the vias 24, and the first defect pattern 120 may be any defect which may occur during a process of forming the first pattern 110.

In operation S110, after the formation of the first pattern group 130, the computer 300 may measure a first image IMG1 of the first pattern group 130. First, the substrate 100 including the first pattern group 130 may be provided onto the stage 400 of the inspection system 1000 described with reference to FIG. 1. In this case, the substrate 100 may be provided on the stage 400 in such a way that a surface of the substrate 100, on which the first pattern group 130 is formed, faces the image measuring apparatus 200. As described with reference to FIG. 7A, the first image IMG1 may be an image measured using the first light source 210 of the image measuring apparatus 200. In other words, the first image IMG1 may be a dark-field image measured by the first optical system using the dark-field illumination. Thus, shapes of patterns formed under the first pattern group 130 may not be projected or reflected to the first image IMG1.

In operation S120, the data processor 310 of the computer 300 described with reference to FIG. 1 may be driven to generate first layout data including information on the shape of the first pattern group 130. In detail, referring again to FIGS. 4 and 7A, in operation S22, the data processor 310 may obtain the first image IMG1 from the image measuring apparatus 200. Referring again to FIGS. 4 and 7B, in operation S24, the data processor 310 may obtain first preliminary layout data P_LAYOUT1 including information on the shape of the first pattern 110. For example, the memory device 320 of the computer 300 may store the first preliminary layout data P_LAYOUT1, and the data processor 310 of the computer 300 may obtain the first preliminary layout data P_LAYOUT1 from the memory device 320. Referring again to FIGS. 4 and 7C, in operation S26, the data processor 310 may compare the first preliminary layout data P_LAYOUT1 with the first image IMG1 to detect the first defect pattern 120 from the first image IMG1. The data processor 310 may select a portion of the first image IMG1, which does not coincide with the information on the shape in the first preliminary layout data P_LAYOUT1, as an image of the first defect pattern 120, and thus the first defect pattern 120 may be detected from the first image IMG1. The data processor 310 may obtain information on a shape of the first defect pattern 120 from the image of the first defect pattern 120. Referring again to FIGS. 4 and 7D, in operation S28, the data processor 310 may add the information on the shape of the first defect pattern 120 into the first preliminary layout data P_LAYOUT1 to generate the first layout data LAYOUT1. The first layout data LAYOUT1 may be stored in the memory device 320.

Referring again to FIGS. 13 and 15, after the measurement of the first image IMG1 of the first pattern group 130, in operation S130, an interlayer layer 180 covering the first pattern group 130 may be formed on the substrate 100. As described with reference to FIGS. 8A and 8B, the interlayer layer 180 may be an insulating layer having a transparent or translucent property. The interlayer layer 180 may include a photosensitive material. The interlayer layer 180 may include the substantially same material as the first insulating layer 22. A via pattern 132 may be formed in the interlayer layer 180. The via pattern 132 may penetrate the interlayer layer 180 so as to be electrically connected to the first pattern group 130 (e.g., the first pattern 110). A defect pattern 140 may be formed in the interlayer layer 180 during the process of forming the interlayer layer 180. The defect pattern 140 may be, for example, a void.

In operation S140, a second pattern group 170 may be formed on the interlayer layer 180. The second pattern group 170 may include a second pattern 150 and a second defect pattern 160, as described with reference to FIGS. 8A and 8B. The second pattern 150 may be an interconnection line pattern electrically connected to the via pattern 132, and the second defect pattern 160 may be any defect which may occur during a process of forming the second pattern 150.

In operation S150, after the formation of the second pattern group 170, the computer 300 may measure a second image IMG2 of the second pattern group 170. In some example embodiments, the substrate 100 including the second pattern group 170 may be provided onto the stage 400 of the inspection system 1000 described with reference to FIG. 1. In this case, the substrate 100 may be provided on the stage 400 in such a way that a surface of the substrate 100, on which the second pattern group 170 is formed, faces the image measuring apparatus 200. As described with reference to FIG. 9A, the second image IMG2 may be an image measured using the first light source 210 of the image measuring apparatus 200. In other words, the second image IMG2 may be a dark-field image measured by the first optical system using the dark-field illumination. Thus, shapes of patterns (e.g., the first pattern group 130 and the defect pattern 140) formed under the second pattern group 170 may not be projected to or included in the second image IMG2.

In operation S160, the data processor 310 of the computer 300 described with reference to FIG. 1 may be driven to generate second layout data including information on the shape of the second pattern group 170. In detail, referring again to FIGS. 5 and 9A, in operation S42, the data processor 310 may obtain the second image IMG2 from the image measuring apparatus 200. Referring again to FIGS. 5 and 9B, in operation S44, the data processor 310 may obtain second preliminary layout data P_LAYOUT2 including information on the shape of the second pattern 150. The memory device 320 of the computer 300 may store the second preliminary layout data P_LAYOUT2, and the data processor 310 of the computer 300 may obtain the second preliminary layout data P_LAYOUT2 from the memory device 320. Referring again to FIGS. 5 and 9C, in operation S46, the data processor 310 may compare the second preliminary layout data P_LAYOUT2 with the second image IMG2 to detect the second defect pattern 160 from the second image IMG2. The data processor 310 may select a portion of the second image IMG2, which does not coincide with the information on the shape in the second preliminary layout data P_LAYOUT2, as an image of the second defect pattern 160, and thus the second defect pattern 160 may be detected from the second image IMG2. The data processor 310 may obtain information on a shape of the second defect pattern 160 from the image of the second defect pattern 160. Referring again to FIGS. 5 and 9D, in operation S48, the data processor 310 may add the information on the shape of the second defect pattern 160 into the second preliminary layout data P_LAYOUT2 to generate the second layout data LAYOUT2. The second layout data LAYOUT2 may be stored in the memory device 320.

In operation S170, after the formation of the second pattern group 170, the computer 300 may measure a target image IMG_T including the images of the first and second pattern groups 130 and 170. The target image IMG_T may be measured before or after measuring the second image IMG2 of the second pattern group 170. As described with reference to FIG. 10, the target image IMG_T may be an image measured using the second light source 220 of the image measuring apparatus 200. In other words, the target image IMG_T may be a bright-field image measured by the second optical system using the bright-field illumination. Thus, shapes of patterns (e.g., the first pattern group 130 and the defect pattern 140) provided under the second pattern group 170 may be projected or reflected to the target image IMG_T. In other words, the target image IMG_T may include the image of the second pattern group 170, and the images of the first pattern group 130 and the defect pattern 140 disposed under the second pattern group 170.

In operation S180, the data processor 310 of the computer 300 described with reference to FIG. 1 may compare the target image IMG_T with the first and second layout data LAYOUT1 and LAYOUT2 to detect the defect pattern 140 from the target image IMG_T. The data processor 310 may obtain the target image IMG_T from the image measuring apparatus 200 and may obtain the first and second layout data LAYOUT1 and LAYOUT2 from the memory device 320. The data processor 310 may select a portion of the target image IMG_T, which does not coincide with the information on the shapes in the first and second preliminary layout data LAYOUT1 and LAYOUT2, as an image of the defect pattern 140, and thus the defect pattern 140 may be detected from the target image IMG_T.

In operation S190, the data processor 310 may be driven to check whether a dimension (e.g., a position or a size) of the defect pattern 140 is in an allowable range.

In operation S200, the computer 300 may generate an alarm, if the dimension of the defect pattern 140 is beyond the allowable range.

Otherwise, in operation S210, the computer 200 may execute subsequent one or more subsequent processes to create a package, if the dimension of the defect pattern 140 is in the allowable range.

For example, a second insulating layer 26 may be formed on the substrate 100 having the second pattern group 170. The second insulating layer 26 may be a transparent or translucent layer and may include, for example, a photosensitive material. The second insulating layer 26 may include the substantially same material as the interlayer layer 180. The second insulating layer 26 may have an opening exposing at least a portion of the second pattern group 170 (i.e., at least a portion of the second pattern 150). A bump 28 may be provided in the opening. The bump 28 may be provided to electrically connect the second pattern group 170 (i.e., the second pattern 150) to an external terminal or an external system. Thus, a fan-out package in which the semiconductor chip 14 is mounted may be manufactured.

Example embodiments of the inventive concepts may provide the inspection method and/or system capable of easily detecting a defect generated in a transparent or translucent interlayer layer by using an optical apparatus. In addition, example embodiments of the inventive concepts may also provide the method of manufacturing a semiconductor package, which is capable of detecting a defect, which may occur in processes of manufacturing the semiconductor package, in an early stage.

While example embodiments of the inventive concepts have been described with reference to some example embodiments, it will be apparent to those skilled in the art that various changes and modifications may be made without departing from the spirits and scopes of the example embodiments of the inventive concepts. Therefore, it should be understood that the above example embodiments are not limiting, but illustrative. Thus, the scopes of the example embodiments of the inventive concepts are to be determined by the broadest permissible interpretation of the following claims and their equivalents, and shall not be restricted or limited by the foregoing description.

What is claimed is:

1. A method of manufacturing a semiconductor package, the method comprising:
forming a first pattern group on a substrate;
measuring a first image of the first pattern group to generate first layout data based on the first image;
forming an interlayer layer on the first pattern group;
forming a second pattern group on the interlayer layer;

measuring a second image of the second pattern group to generate second layout data based on the second image subsequent to forming the interlayer layer;

measuring a third image including the first image and the second image to generate third layout data based on the third image; and detecting a defect pattern based on the first layout data, the second layout data, and the third layout data, the defect pattern being at a height from the substrate between the first pattern group and the second pattern group.

2. The method of claim 1, wherein
the defect pattern is in the interlayer layer between the first pattern group and the second pattern group, and
the third image includes an image of the defect pattern.

3. The method of claim 2, wherein the detecting of the defect pattern comprises:
comparing the third layout data with the first layout data and the second layout data; and
selecting a portion of the third layout data as an information of the defect pattern such that the portion of the third layout data does not coincide with the first layout data and the second layout data.

4. The method of claim 1, wherein
the first image and the second image are obtained using a first optical system,
the third image is obtained using a second optical system, and
the second optical system has a depth of focus greater than that of the first optical system.

5. The method of claim 1, wherein
the first image and the second image are obtained using a first optical system including a first light source, and
the third image is obtained using a second optical system including a second light source different from the first light source.

6. The method of claim 5, wherein
a first light of the first light source is incident in a direction inclined to a top surface of the substrate, and
a second light of the second light source is incident in a direction vertical to the top surface of the substrate.

7. The method of claim 5, wherein
the first optical system is a dark-field illumination system, and
the second optical system is a bright-field illumination system.

8. A method of manufacturing a semiconductor package, the method comprising:
forming a first pattern group on a substrate;
measuring a first image of the first pattern group to generate first layout data based on the first image, the first image obtained using a first light source;
forming an interlayer layer on the first pattern group;
forming a second pattern group on the interlayer layer;
measuring a second image of the second pattern group to generate second layout data based on the second image subsequent to forming the interlayer layer, the second image obtained using the first light source;
measuring a third image including the first image and the second image to generate third layout data based on the third image, the third image obtained using a second light source different from the first light source; and
detecting a defect pattern based on the first layout data, the second layout data, and the third layout data, the defect pattern being at a height from the substrate between the first pattern group and the second pattern group.

9. The method of claim 8, wherein the detecting of the defect pattern comprises:
comparing the third layout data with the first layout data and the second layout data; and
selecting a portion of the third layout data as an information of the defect pattern such that the portion of the third layout data does not coincide with the first layout data and the second layout data.

10. The method of claim 8, wherein the substrate comprises:
a support substrate including a plurality of cavities penetrating the support substrate;
semiconductor chips in the plurality of cavities; and
a mold layer on a first surface of the support substrate to cover the semiconductor chips, the mold layer extending into the cavities such that the mold layer is between the support substrate and the semiconductor chips, wherein
the first pattern group, the second pattern group, and the defect pattern are on a second surface of the support substrate, the second surface being opposite the first surface.

11. The method of claim 10, wherein:
the first and second pattern groups include interconnection line patterns, the interconnection line patterns configured to electrically connect the semiconductor chips to external terminals, and
the defect pattern is in a transparent or translucent insulating layer between the first pattern group and the second pattern group.

12. The method of claim 8, wherein a first light of the first light source is incident in a direction inclined to a top surface of the substrate.

13. The method of claim 8, wherein a second light of the second light source is incident in a direction vertical to a top surface of the substrate.

14. The method of claim 8, wherein the first image and the second image are obtained using a first optical system including the first light source,
the third image is obtained using a second optical system including the second light source, and
the second optical system has a depth of focus greater than that of the first optical system.

15. The method of claim 14, wherein the first optical system is a dark-field illumination system, and the second optical system is a bright-field illumination system.

16. The method of claim 8, wherein a first light of the first light source is incident in a direction inclined to a top surface of the substrate, and a second light of the second light source is incident in a direction vertical to a top surface of the substrate.

17. A method of manufacturing a semiconductor package, the method comprising:
forming a first pattern group on a substrate;
measuring a first image of the first pattern group to generate first layout data based on the first image, the first image obtained using a first light source configuring a dark-field illumination system;
forming an interlayer layer on the first pattern group;
forming a second pattern group on the interlayer layer;
measuring a second image of the second pattern group to generate second layout data based on the second image subsequent to forming the interlayer layer, the second image obtained using the first light source;
measuring a third image including the first image and the second image to generate third layout data based on the third image, the third image obtained using a second light source configuring a bright-field illumination system; and detecting a defect pattern based on the first layout data, the second layout data, and the third layout data, the defect pattern being at a height from the substrate between the first pattern group and the second pattern group.

18. The method of claim 17, wherein the defect pattern is in the interlayer layer between the first pattern group and the second pattern group.

19. The method of claim 18, wherein the third image includes an image of the defect pattern, and wherein the detecting of the defect pattern comprises:

comparing the third layout data with the first layout data and the second layout data; and selecting a portion of the third layout data as an information of the defect pattern such that the portion of the third layout data does not coincide with the first layout data and the second layout data.

20. The method of claim 17, wherein the substrate comprises:

a support substrate including a plurality of cavities penetrating the support substrate;

semiconductor chips in the plurality of cavities; and a mold layer on a first surface of the support substrate to cover the semiconductor chips, the mold layer extending into the cavities such that the mold layer is between the support substrate and the semiconductor chips, wherein the first pattern group, the second pattern group, and the defect pattern are on a second surface of the support substrate, the second surface being opposite the first surface, the first and second pattern groups include interconnection line patterns, the interconnection line patterns configured to electrically connect the semiconductor chips to external terminals, and the defect pattern is in a transparent or translucent insulating layer between the first pattern group and the second pattern group.

* * * * *